United States Patent
Kitagawa et al.

(10) Patent No.: US 9,831,420 B2
(45) Date of Patent: Nov. 28, 2017

(54) MAGNETORESISTIVE ELEMENT AND MAGNETIC MEMORY

(71) Applicant: Toshiba Memory Corporation, Tokyo (JP)

(72) Inventors: Eiji Kitagawa, Yokohama (JP); Takao Ochiai, Funabashi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/067,744

(22) Filed: Mar. 11, 2016

(65) Prior Publication Data
US 2016/0197266 A1    Jul. 7, 2016

Related U.S. Application Data

(63) Continuation of application No. PCT/JP2014/067567, filed on Jul. 1, 2014.

(30) Foreign Application Priority Data

Sep. 19, 2013  (JP) .................................. 2013-194180

(51) Int. Cl.
*H01L 43/02*  (2006.01)
*H01L 43/08*  (2006.01)
(Continued)

(52) U.S. Cl.
CPC ............ *H01L 43/02* (2013.01); *G11C 11/161* (2013.01); *H01F 10/30* (2013.01);
(Continued)

(58) Field of Classification Search
CPC .............................. H01F 10/3286; H01L 43/02
See application file for complete search history.

(56) References Cited

U.S. PATENT DOCUMENTS 5,341,118 A * 8/1994 Parkin .................... B82Y 10/00
                                                        257/E43.005
6,518,588 B1 * 2/2003 Parkin .................... B82Y 10/00
                                                        257/285
(Continued)

FOREIGN PATENT DOCUMENTS

JP  2012-59808 A  3/2012
JP  2012-64818 A  3/2012
(Continued)

OTHER PUBLICATIONS

English translation of International Search Report issued on Oct. 7, 2014 in PCT/JP2014/067567.

*Primary Examiner* — Jarrett Stark
*Assistant Examiner* — Charles N Ausar-El
(74) *Attorney, Agent, or Firm* — Oblon, McClelland, Maier & Neustadt, L.L.P.

(57) ABSTRACT

A magnetoresistive element according to an embodiment includes: a first layer containing nitrogen; a reference layer opposed to the first layer, the reference layer having a magnetization perpendicular to a face thereof opposed to the first layer, the magnetization of the reference layer being fixed; a storage layer disposed between the first layer and the reference layer, the storage layer having a magnetization perpendicular to a face thereof opposed to the first layer, the magnetization of the storage layer being changeable, and the storage layer including a second layer containing boron, and a third layer disposed between the second layer and the reference layer and containing boron, a boron concentration of the third layer being lower than a boron concentration of the second layer; and an intermediate layer disposed between the third layer and the reference.

19 Claims, 11 Drawing Sheets

(51) Int. Cl.
*H01L 43/10* (2006.01)
*H01L 27/22* (2006.01)
*G11C 11/16* (2006.01)
*H01F 10/30* (2006.01)
*H01F 10/32* (2006.01)

(52) U.S. Cl.
CPC ....... *H01F 10/3286* (2013.01); *H01L 27/228* (2013.01); *H01L 43/08* (2013.01); *H01L 43/10* (2013.01)

(56) References Cited

U.S. PATENT DOCUMENTS

| | | | | |
|---|---|---|---|---|
| 6,801,414 | B2* | 10/2004 | Amano | B82Y 10/00 257/E21.665 |
| 8,545,999 | B1* | 10/2013 | Leng | H01L 43/12 360/324.11 |
| 9,117,924 | B2 | 8/2015 | Kitagawa et al. | |
| 9,117,995 | B2 | 8/2015 | Daibou et al. | |
| 9,165,585 | B2 | 10/2015 | Kitagawa et al. | |
| 9,178,133 | B2 | 11/2015 | Kitagawa et al. | |
| 9,236,560 | B1* | 1/2016 | Li | H01L 43/08 |
| 9,679,765 | B2* | 6/2017 | Larson, III | H01L 21/02518 |
| 2005/0110004 | A1* | 5/2005 | Parkin | B82Y 25/00 257/30 |
| 2006/0262594 | A1* | 11/2006 | Fukumoto | B82Y 25/00 365/158 |
| 2007/0007609 | A1* | 1/2007 | Saito | G11C 11/15 257/421 |
| 2010/0072528 | A1* | 3/2010 | Inokuchi | H01L 29/66984 257/295 |
| 2010/0188771 | A1* | 7/2010 | Okamura | B82Y 10/00 360/75 |
| 2010/0254182 | A1* | 10/2010 | Kuroiwa | G11C 11/16 365/158 |
| 2011/0260272 | A1* | 10/2011 | Lee | B82Y 25/00 257/421 |
| 2012/0056285 | A1* | 3/2012 | Bessho | G11C 11/16 257/421 |
| 2012/0068284 | A1* | 3/2012 | Kitagawa | H01L 43/08 257/421 |
| 2012/0070695 | A1 | 3/2012 | Kitagawa et al. | |
| 2012/0163070 | A1 | 6/2012 | Nagase et al. | |
| 2012/0241881 | A1* | 9/2012 | Daibou | H01L 43/10 257/421 |
| 2013/0028011 | A1* | 1/2013 | Kitagawa | G11C 11/161 365/158 |
| 2013/0069182 | A1* | 3/2013 | Ohsawa | H01L 29/82 257/421 |
| 2013/0077388 | A1* | 3/2013 | Inokuchi | G11C 11/16 365/158 |
| 2013/0307099 | A1* | 11/2013 | Kitagawa | H01L 29/82 257/421 |
| 2014/0131824 | A1* | 5/2014 | Kitagawa | G11C 11/161 257/425 |
| 2014/0175575 | A1* | 6/2014 | Doyle | H01L 43/08 257/421 |
| 2017/0187347 | A1* | 6/2017 | Rinaldi | H03H 9/133 |

FOREIGN PATENT DOCUMENTS

| | | |
|---|---|---|
| JP | 2013-48210 A | 3/2013 |
| JP | 2013-243220 A | 12/2013 |
| JP | 2014-99497 A | 5/2014 |
| WO | WO 2011/121777 A1 | 10/2011 |
| WO | WO 2013/015004 A1 | 1/2013 |

* cited by examiner

MAGNETORESISTIVE ELEMENT AND MAGNETIC MEMORY

CROSS REFERENCE TO RELATED APPLICATIONS

This application is a continuation of International Application No. PCT/JP2014/067567, filed on Jul. 1, 2014, which is based upon and claims the benefit of priority from the prior Japanese Patent Application No. 2013-194180, filed on Sep. 19, 2013, the entire contents of which are incorporated herein by reference.

FIELD

Embodiments described herein relate generally to magnetoresistive elements and magnetic memories.

BACKGROUND

Spin transfer torque magnetic random access memories (STT-MRAMs) serving as nonvolatile memories that do not lose information when used in high-speed reading and writing have received attention. STT-MRAMs may replace volatile memories in electronic devices. This may reduce the power consumption since the STT-MRAMs do not require standby power. In order to further reduce the power consumption, however, the write current used to perform a write operation on magnetic tunnel junction (MTJ) elements serving as storage elements of the STT-MRAMs should be lowered. An MTJ element has a multilayer structure in which a tunnel barrier layer is disposed between two magnetic layers. In order to reduce the write current, perpendicular magnetization MTJ elements, in which the magnetization direction in the magnetic layers of each MTJ element is perpendicular to the film plane, are employed. The "film plane" herein means a plane perpendicular to the stacking direction of layers constituting the MTJ elements.

DETAILED DESCRIPTION

A magnetoresistive element according to an embodiment includes: a first layer containing nitrogen; a reference layer opposed to the first layer, the reference layer having a magnetization perpendicular to a face thereof opposed to the first layer, the magnetization of the reference layer being fixed; a storage layer disposed between the first layer and the reference layer, the storage layer having a magnetization perpendicular to a face thereof opposed to the first layer, the magnetization of the storage layer being changeable, and the storage layer including a second layer containing boron, and a third layer disposed between the second layer and the reference layer and containing boron, a boron concentration of the third layer being lower than a boron concentration of the second layer; and an intermediate layer disposed between the third layer and the reference.

Embodiments will now be explained with reference to the accompanying drawings.

(First Embodiment)

Figure 1:
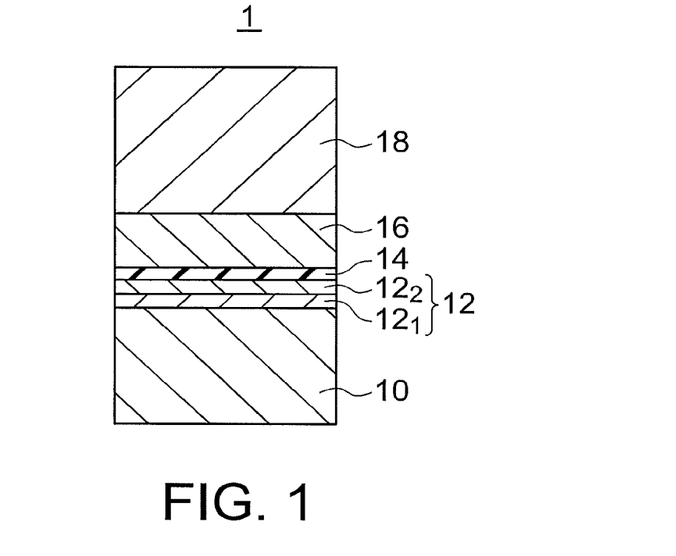
FIG. 1 is a cross-sectional view showing a magnetoresistive element according to a first embodiment.

FIG. 1 shows a magnetoresistive element according to a first embodiment. The magnetoresistive element according to the first embodiment has a multilayer structure in which a base layer 10, a storage layer 12 including a magnetic layer of which the direction of magnetization is changeable, an intermediate layer 14, a reference layer 16 including a magnetic layer of which the direction of magnetization is fixed, and an electrode 18 are stacked in this order. The "changeable" direction of magnetization herein means that a write current caused to flow in a direction perpendicular to the film plane of the magnetoresistive element may change the direction of magnetization. The "fixed" direction of magnetization herein means that the write current caused to flow in a direction perpendicular to the film plane of the magnetoresistive element may not change the direction of magnetization. The magnetic layers of the storage layer 12 and the reference layer 16 each have a magnetization perpendicular to the film plane. Thus, the magnetic layers of the storage layer 12 and the reference layer 16 each have a magnetic anisotropy perpendicular to the film plane.

The electric resistance between the base layer 10 and the electrode 18 varies depending on whether the magnetization direction of the storage layer 12 is parallel to or antiparallel (opposite) to the magnetization direction of the reference layer 16. A number "0" is assigned to data to be stored in the magnetoresistive element in one of the parallel case and the antiparallel case, and a number "1" is assigned to data to be stored in the magnetoresistive element in the other.

A write operation to change the magnetization direction of the storage layer 12 from antiparallel to parallel to the magnetization direction of the reference layer 16 will be described below. In this case, a write current is caused to flow from the storage layer 12 to the reference layer 16, i.e., from the base layer 10 to the electrode 18. An electron current flows in a direction opposite to the direction of the write current. Therefore, the electron current flows from the reference layer 16 to the storage layer 12 via the intermediate layer 14. The electrons passing through the reference layer 16 are spin-polarized by the reference layer 16, and flows to the storage layer 12 via the intermediate layer 14. The magnetization direction of the storage layer 12 is caused to be in parallel to the magnetization direction of the reference layer 16 by spin transfer torque switching. Then, the write operation ends.

A write operation to change the magnetization direction of the storage layer 12 from parallel to antiparallel to the magnetization direction of the reference layer 16 will next be described below. In this case, a write current is caused to flow from the reference layer 16 to the storage layer 12, i.e., from the electrode 18 to the base layer 10. As a result, an electron current flows from the storage layer 12 to the reference layer via the intermediate layer 14. The electrons passing through the storage layer 12 are spin-polarized. The electrons that are spin-polarized in a direction parallel to the magnetization direction of the reference layer 16 pass through the reference layer 16, but electrons that are spin-polarized in an antiparallel direction are reflected at the interface between the intermediate layer 14 and the reference layer 16, and flow into the storage layer 12 via the intermediate layer 14. The electrons that are spin-polarized in the direction antiparallel to the magnetization direction of the reference layer 16 flowing into the storage layer 12 switch the magnetization direction of the storage layer 12 from parallel to antiparallel by spin transfer torque switching. Then, the write operation ends.

A read operation to read data from the magnetoresistive element 1 is performed by causing a read current to flow between the base layer 10 and the electrode 18, for example, and measuring the voltage between the base layer 10 and the electrode 18.

In the first embodiment, the storage layer 12 has a multilayer structure including layers with different boron concentrations. For example, the storage layer 12 includes a first layer $12_1$ disposed between the base layer 10 and the intermediate layer 14, and a second layer $12_2$ disposed between the first layer $12_1$ and the intermediate layer 14. The boron concentration (atomic %) in the first layer $12_1$ is higher than the boron concentration (atomic %) in the second layer $12_2$. For example, the first layer $12_1$ is formed of $Co_{20}Fe_{20}Hf_{25}B_{35}$ with the boron concentration of 35 atomic %, and the second layer $12_2$ is formed of $Co_{16}Fe_{64}B_{20}$ with the boron concentration of 20 atomic %.

Figure 2:
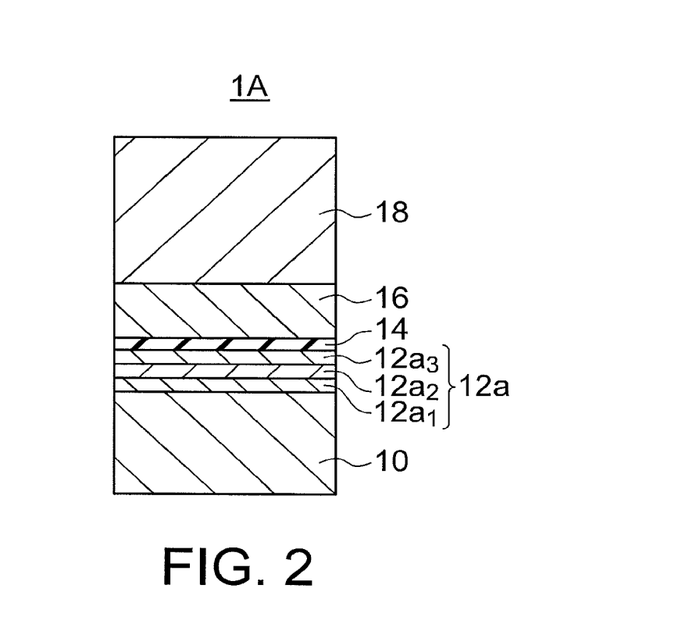
FIG. 2 is a cross-sectional view showing a magnetoresistive element according to a first modification of the first embodiment.

A magnetoresistive element 1A according to a first modification of the first embodiment shown in FIG. 2 may also be employed. The magnetoresistive element 1A according to the first modification is obtained by replacing the storage layer 12 of the magnetoresistive element 1 according to the first embodiment shown in FIG. 1 with a storage layer 12a. The storage layer 12a has a multilayer structure including layers with different boron concentrations. Specifically, the storage layer 12a includes a first layer $12a_1$ disposed between the base layer 10 and the intermediate layer 14, a second layer $12a_2$ disposed between the first layer $12a_1$ and the intermediate layer 14, and a third layer $12a_3$ disposed between the second layer $12a_2$ and the intermediate layer 14. The boron concentration (atomic %) of the first layer $12a_1$ is lower than the boron concentration (atomic %) of the second layer $12a_2$, and the boron concentration (atomic %) of the third layer $12a_3$ is lower than the boron concentration (atomic %) of the second layer $12a_2$. For example, the first and third layers $12a_1$ and $12a_3$ are formed of $Co_{16}Fe_{64}B_{20}$ with the boron concentration of 20 atomic %, and the second layer $12a_2$ is formed of $Hf_{50}B_{50}$ with the boron concentration of 50 atomic %.

The base layer 10 may be a single film containing nitrogen and at least one element other than nitrogen.

Figure 3:
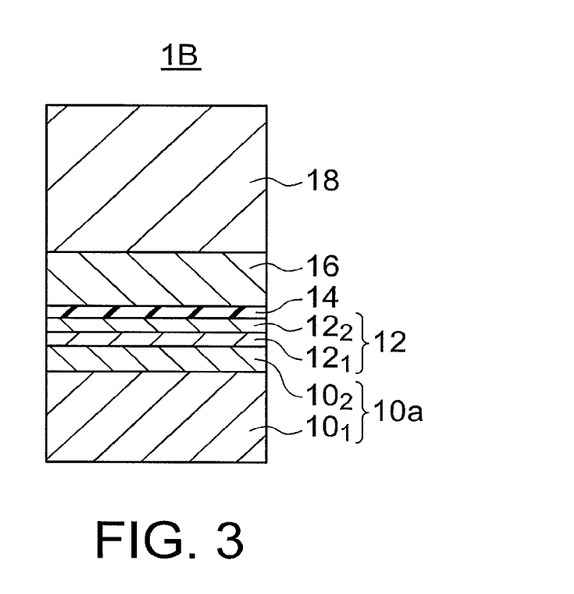
FIG. 3 is a cross-sectional view of a magnetoresistive element according to a second modification of the first embodiment.

A magnetoresistive element 1B according to a second modification of the first embodiment shown in FIG. 3 may also be employed. The magnetoresistive element 1B according to the second modification is obtained by replacing the base layer 10 of the magnetoresistive element 1 according to the first embodiment shown in FIG. 1 with a base layer 10a. The base layer 10a includes a first base layer $10_1$ and a second base layer $10_2$ disposed between the first base layer $10_1$ and the storage layer 12. The base layer $10_1$ contains at least one of Hf, Zr, Al, Be, Mg, Ca, Sr, Ba, Sc, Y, and La, and the second base layer $10_2$ contains nitrogen and at least one element other than nitrogen. The first base layer $10_1$ preferably contains less nitrogen than the second base layer $10_2$, or no nitrogen. This makes it easy to flatten the first base layer $10_1$.

Figure 4:
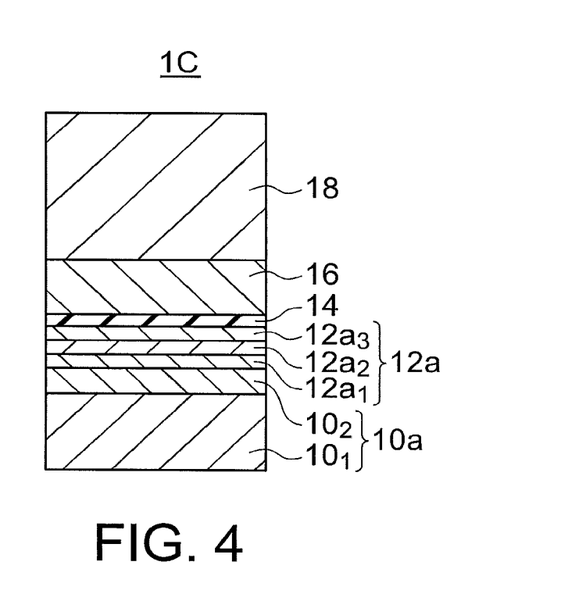
FIG. 4 is a cross-sectional view of a magnetoresistive element according to a third modification of the first embodiment.

A magnetoresistive element 1C according to a third modification of the first embodiment shown in FIG. 4 may also be employed. The magnetoresistive element 1C according to the third modification may be obtained by replacing the base layer 10 of the magnetoresistive element 1A according to the first modification shown in FIG. 2 with a base layer 10a. The base layer 10a has the same structure as the base layer 10a of the second modification shown in FIG. 3.

The storage layer 12 is a magnetic layer containing Fe, and the base layer 10 contains nitrogen and easily forms a nitride in each of the first embodiment and its modifications. As a result, the interdiffusion of elements constituting the storage layer 12 and the base layer 10 may be prevented since the coupling energy of Fe with nitrogen is weak, and nitrogen may be selectively coupled with an element in the base layer 10.

If the nitride of the base layer 10 is a compound of nitrogen and at least one of Al, Sc, Y, La, Ti, Zr, Hf, and In, a stable base layer with a high melting point may be obtained. This may prevent the interdiffusion of the elements constituting the storage layer 12 and the base layer 10. The first base layer and/or the second base layer may be formed of AlN, for example. Since AlN has an insulating property, such materials as AlTiN, AlScN, ScN, and AlInN are more preferable since these materials may a have lower resistance. Therefore, the base layer 10 preferably contains nitrogen and at least one of Al, Sc, Y, and La. Since the base layer 10 preferably has a satisfactorily lower resistance than the intermediate layer 14, the thickness of the base layer 10 is preferably 0.2 nm or more and 2 nm or less. The AlInN, AlScN, or AlTiN film may be a continuous film, or may be separated by another material. Mixing AlN, which has the hexagonal close-packed structure, with TiN or ScN, which has the tetragonal structure, makes amorphous nitride. As a result, a flat base layer 10 may be formed. The storage layer 12 may have a lower Gilbert damping constant if the exchange of electrons and the interdiffusion of elements between the storage layer 12 and the base layer 10 are suppressed to reduce the spin pumping effect. As a result, the write current may be reduced.

Figure 16:
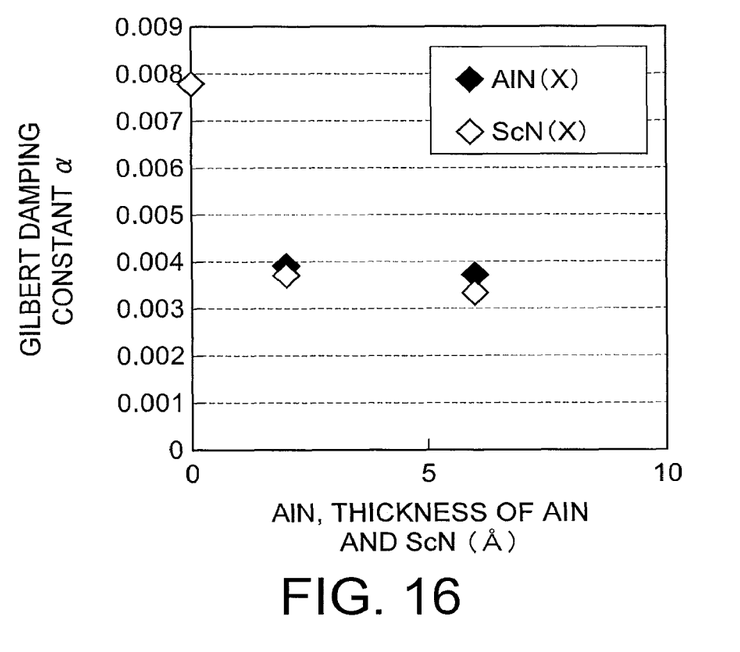
FIG. 16 is a diagram showing the values of the Gilbert damping constant of a AlN layer and a ScN layer in relation to the thicknesses thereof, the AlN layer and the ScN layer serving as the base layer for a storage layer of $Co_8Fe_{72}B_{20}$

FIG. 16 shows values of the Gilbert damping constant of a AlN layer and a ScN layer in relation to the thicknesses thereof, the AlN layer and the ScN layer serving as the base layer 10 for a 13 Å storage layer 12 of $Co_8Fe_{72}B_{20}$. The Gilbert damping constant may be satisfactorily reduced if the thickness of the AlN layer and the ScN layer is 2 Å (0.2 nm) or more. In consideration of the resistance of the nitride base layer, it is preferable that the thickness of the AlN layer and the ScN layer be 0.2 nm or more and 2 nm or less.

If the storage layer 12 on the base layer 10 of nitride contains iron and boron, the wettability of the storage layer 12 for the base layer 10 is not good, which makes the surface of the storage layer 12 irregular. Furthermore, boron in the storage layer 12 and nitrogen in the base layer 10 may have strong coupling properties. As a result, a heat treatment performed after the magnetoresistive element 1 is formed may prevent the storage layer 12 from changing from an amorphous state to a crystalline state, thereby lowering the MR ratio. The low MR ratio may lead to a decrease in spin torque applied to the storage layer 12 to increase the write current.

If, for example, the first layer $12_1$ shown in FIG. 1 of the storage layer 12 contains highly concentrated boron, the wettability of the storage layer 12 degraded by nitrogen of the base layer 10 is improved by the highly concentrated boron. The lack of boron caused by the coupling of boron and nitrogen is compensated by the highly concentrated boron. As a result, crystallization between the intermediate layer 14 and the storage layer 12 is advanced. If the storage layer 12 or the storage layer 12a is formed on the base layer 10 or the top surface of the multilayer structure of the base layer 10a, the amorphous state of the storage layer 12 or 12a is improved by the highly concentrated boron. As a result, the smoothness and the MR ratio of the storage layer 12 or 12a may be improved.

The material of the first base layer $10_1$ is preferably conductive, and may be oxidized to become an insulating material. This allows the material of the first base layer $10_1$ to become an insulating material if it is oxidized during the re-deposition as an accretion caused by etching on the side portions of the intermediate layer 14 when the magnetoresistive element is processed. Therefore, the first base layer $10_1$ is formed of a material containing at least one of Hf, Zr, Al, Be, Mg, Ca, Sr, Ba, Sc, Y, and La. If a material that is easy to be oxidized to form an insulator with good quality during re-deposition is used to form the first base layer $10_1$, and if MgO is used to form the intermediate layer 14, the element contained in the first base layer $10_1$ attached to the sidewall of the intermediate layer 14 may be changed to an insulating material by natural oxidation during the separation of the magnetoresistive elements. This may prevent short-circuit of the magnetoresistive elements caused by the separation processing. If the thickness of the re-deposition including the element of the first base layer $10_1$ is adjusted to be in a range of about 0.5 nm to 5 nm, the damage to the magnetoresistive elements caused by oxidation due to the exposure to the atmosphere after the magnetoresistive elements are separated may be prevented. This may suppress an increase in the write current and a decrease in the thermal stability.

The intermediate layer 14 may be formed of an insulating material such as MgO. If MgO is used, the intermediate layer 14 serves as a tunnel barrier layer.

The reference layer 16 may be a multilayer film including, for example, a TbCoFe layer and a CoFeB layer. A high MR ratio may be obtained by disposing a CoFeB layer between a TbCoFe layer and a tunnel barrier layer of MgO. If a shift adjustment layer of CoPt is disposed between the reference layer 16 and the electrode 18, the magnetic field applied from the reference layer 16 to the storage layer 12 or 12a may be cancelled. This would stably makes the magnetization of the storage layer 12 or 12a oriented to be parallel or antiparallel to the magnetization of the reference layer 16. If a nonmagnetic layer of Ru is disposed between the reference layer 16 and the shift adjustment layer, the magnetization of the reference layer and the magnetization of the shift adjustment layer may be coupled to be antiparallel to each other. This may stably cancel the stray magnetic field from the reference layer.

The electrode 18 may be a multilayer film including a 10-nm-thick Ru layer and a 100-nm-thick Ta layer, disposed on the reference layer 16.

As described above, the first embodiment may reduce the write current.

(Second Embodiment)

Figure 5:
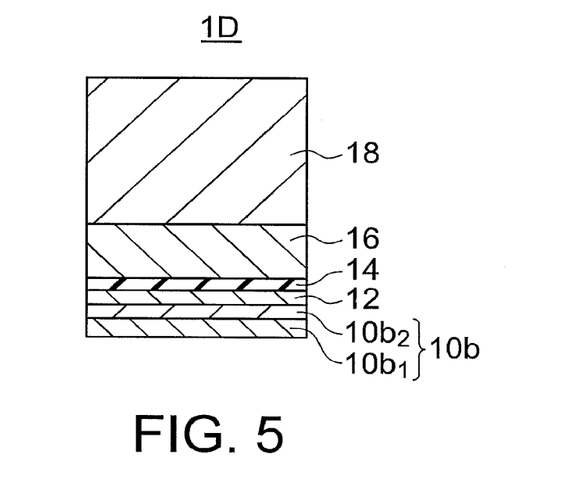
FIG. 5 is a cross-sectional view of a magnetoresistive element according to a second embodiment.

FIG. 5 shows a magnetoresistive element according to a second embodiment. The magnetoresistive element 1D according to the second embodiment has a multilayer structure in which a base layer 10b, a storage layer 12 including a magnetic layer containing boron, an intermediate layer 14, a reference layer 16 including a magnetic layer, and an electrode 18 are stacked in this order. The magnetization direction of the magnetic layer of the storage layer 12 is changeable, and the magnetization direction of the magnetic layer of the reference layer 16 is fixed.

The storage layer 12 of the second embodiment contains, for example, $Co_{16}Fe_{64}B_{20}$. A high perpendicular magnetic anisotropy may be obtained for this material since the content of Fe is set to be higher than the content of Co. A high perpendicular magnetic anisotropy would improve the nonvolatile performance of devices, thereby contributing to a decrease in power consumption.

The base layer 10b has a multilayer structure in which a first base layer $10b_1$ containing nitrogen and a second base layer $10b_2$ containing boron, disposed between the first base layer $10b_1$ and the storage layer 12 are stacked as shown in FIG. 5. The boron concentration (atomic %) of the second base layer $10b_2$ is higher than the boron concentration (atomic %) of the storage layer 12.

The second base layer $10b_2$ is formed of, for example, $Hf_{50}B_{50}$ with a thickness of 1 nm or less. The boron concentration of the second base layer $10b_2$ is higher than the boron concentration (20 atomic %) of the storage layer 12 of $Co_{16}Fe_{64}B_{20}$. The first base layer $10b_1$ is formed of AlN with a thickness of about 1 nm, or nitride as used in the first embodiment. For example, AlInN, AlScN, AlYN, AlLaN, and ScN may be used to form the first base layer $10b_1$. Thus, the first base layer $10b_1$ preferably contains nitrogen and at least one of Al, Sc, Y, and La. The thickness of the AlInN, AlScN, AlYN, AlLaN, or ScN layer is preferably 0.2 nm or more and 2 nm or less as in the case of the first embodiment. As will be described in the descriptions of the third embodiment, if AlInN is used, the ratio of In is preferably lower than the ratio of Al, and if AlScN, AlYN, or AlLaN is used, the ratio of Al is preferably lower than the ratio of Sc, V, or La. The same applies to the first embodiment. The AlInN, AlScN, AlYN, AlLaN, or ScN layer may be continuous, or separated by another material.

Figure 6:
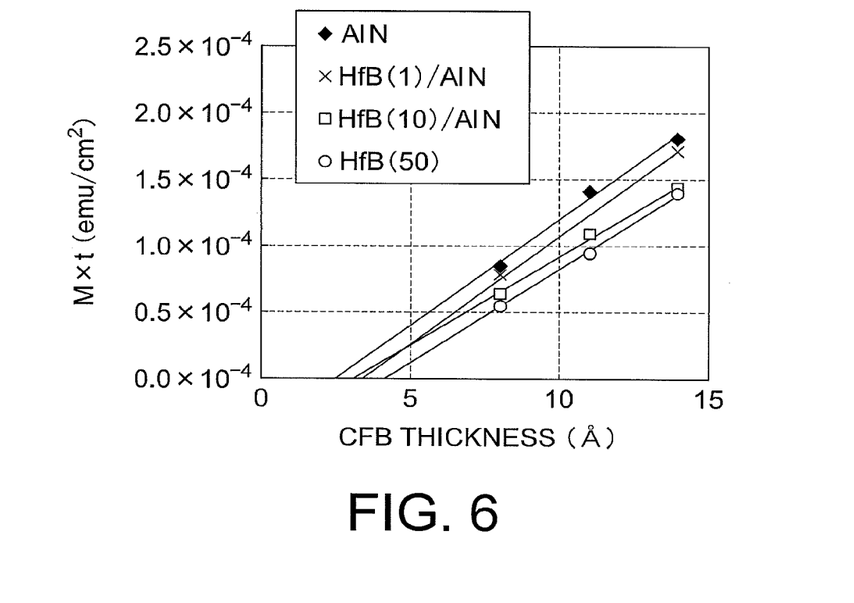
FIG. 6 is a diagram showing the dependency of the magnetization of the storage layer on the base layer.

The use of the second base layer $10b_2$ with a higher boron concentration than the storage layer 12 as in the second embodiment may improve the wettability between the base layer 10 containing a nitride and the storage layer 12 containing Fe as a main constituent. As the thickness of the second base layer $10b_2$ increases, the magnetization of the storage layer 12 decreases as shown in FIG. 6. The lateral axis of FIG. 6 indicates the thickness of the storage layer 12 ($Co_{16}Fe_{64}B_{20}$), and the longitudinal axis indicates the magnetization (saturation magnetization density (M)×thickness (t)) of the storage layer 12. In FIG. 6, the black diamond marks represent the base layer 10b including only the first base layer $10b_1$ of AlN, the cross marks represent the base layer 10b including the first base layer $10b_1$ of AlN and the second base layer $10b_2$ of $Hf_{50}B_{50}(1)$ (where (1) indicates that the thickness of the $Hf_{50}B_{50}$ layer is 1 Å (=0.1 nm)), white square marks represent the base layer 10b including the first base layer $10b_1$ of AlN and the second base layer $10b_2$ of $Hf_{50}B_{50}(10)$ (where (10) indicates that the thickness of the $Hf_{53}B_{50}$ layer is 10 Å (=1 nm)), and white circle marks represent the base layer 10b including only a $Hf_{50}B_{50}(50)$ layer (where (50) indicates that the thickness of the $Hf_{50}B_{50}$ layer is 50 Å (=5 nm)). As can be understood from FIG. 6, the magnetization may be reduced by disposing a base layer containing boron between the storage layer and a base layer containing nitride, or by directly disposing a base layer containing boron on the storage layer. The decrease in magnetization occurring between the base layer and the storage layer leads to an increase in damping constant (Gilbert damping constant) due to the spin pumping effect, which further leads to an increase in the write current. Therefore, the thickness of the second base layer $10b_2$ is preferably 1 nm or less, at which the amount of the decrease in magnetization of the storage layer 12 is less than the amount in the case where a base layer of boride is used.

Figure 14:
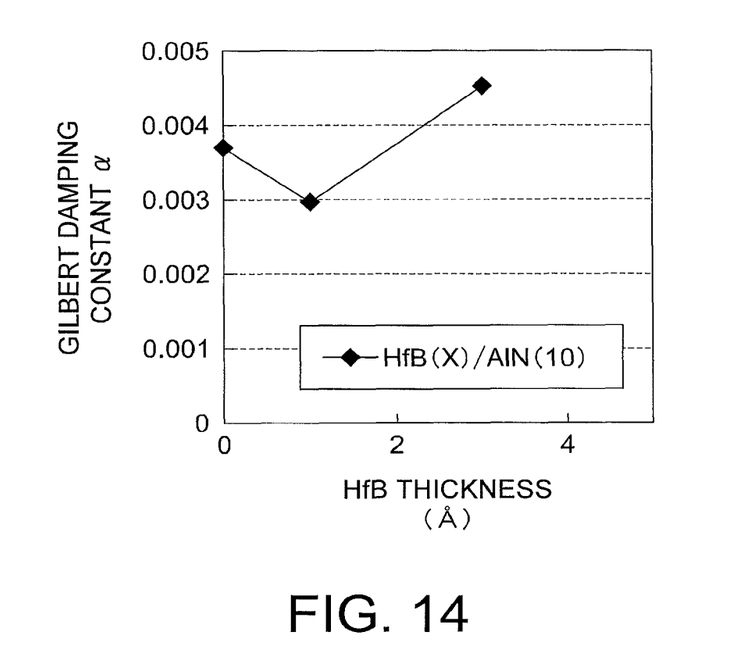
FIG. 14 is a diagram showing the relationship between the thickness and the Gilbert damping constant of a base layer containing boron disposed between the storage layer and a base layer containing nitride.

FIG. 14 shows the relationship between the thickness and the Gilbert damping constant of the base layer $10b_2$ containing boron disposed between the storage layer 12 and the first base layer $10b_1$ containing nitride. The Gilbert damping constant in a case where the base layer 10b containing $Hf_{50}B_{50}$ is directly disposed on the storage layer is 0.0074, and the Gilbert damping constant in a case where a base layer containing AlN is directly disposed on the storage layer is 0.0037. It can be understood from FIG. 14 that the Gilbert damping constant may be reduced by disposing a base layer of $Hf_{50}B_{50}$ having a thickness of 1 Å, which contains boron, between the nitride base layer $10b_1$ of AlN and the storage layer 12 as compared to the case where the AlN layer is directly bonded to the storage layer. The wettability between the nitride base layer $10b_1$ and the storage layer 12 may be improved by disposing a very thin base layer $10b_2$ containing boron between the storage layer 12 and base layer 10b. As a result, a uniform storage layer may be formed. A uniform storage layer may lead to an improvement in Curie temperature ($T_c$) of the storage layer. The improvement in $T_c$ may prevent spin information from being lost, and may allow the Gilbert damping constant and the write current to be decreased.

Figure 15:
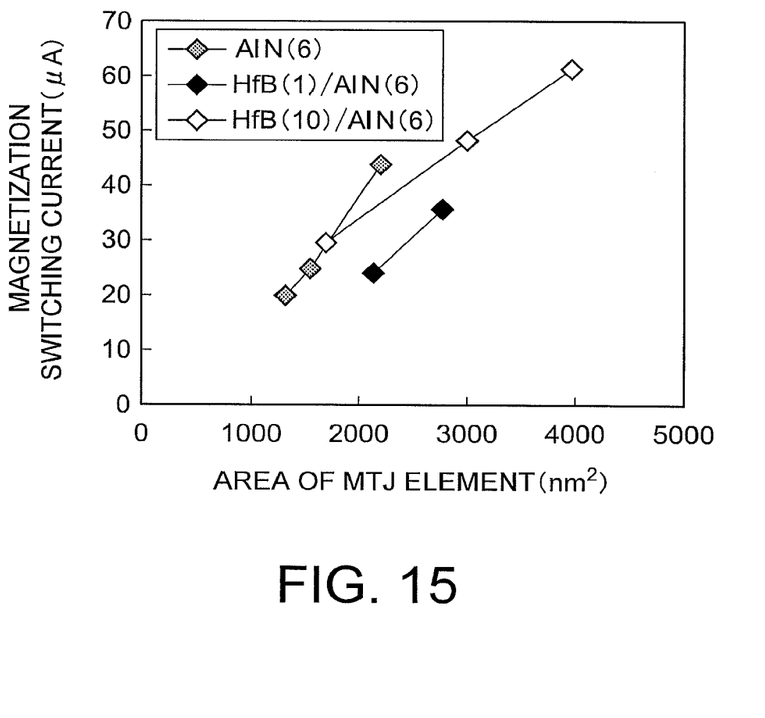
FIG. 15 shows values of a magnetization switching current required for switching magnetization direction of the storage layer from parallel to antiparallel relative to the magnetization direction of the reference layer, the storage layer having a multilayer structure including a 10 Å $Hf_{50}B_{50}$ layer and a 6 Å AlN layer.

FIG. 15 shows values of a current (magnetization switching current) required for switching magnetization of the storage layer 12 from parallel to antiparallel relative to the magnetization of the reference layer 16 in cases where the base layer 10b is a 6 Å AlN layer, a multilayer including a 1 Å $Hf_{50}B_{50}$ layer and a 6 Å AlN layer, and a multilayer including a 10 Å $Hf_{50}B_{50}$ layer and a 6 Å AlN layer. The lateral axis of FIG. 15 indicates the area of the MTJ element. If the area of the MTJ element is the same, the magnetization switching current in the case where the base layer 10b has the multilayer structure including a 1 Å $Hf_{50}B_{50}$ layer and a 6 Å AlN layer is less than the magnetization switching current in the case where the base layer 10b is simply a AlN layer. The decrease in switching current leads to the decrease in write current. Therefore, MTJ elements with lower power consumption may be manufactured. In order to obtain a high MR ratio, the thickness of the base layer $10b_2$ of $Hf_{50}B_{50}$, which contains boron, is preferably thick. However, a thick $Hf_{50}B_{50}$ layer disposed between the storage layer 12 and the nitride base layer $10b_1$ may increase the Gilbert damping constant as shown in FIG. 14, and may increase the magnetization switching current as shown in FIG. 15. Thus, a too thick layer is not preferable. Therefore, the thickness of the base layer $10b_2$ containing boron is preferably set to be 1 nm or less.

(Modification)

Figure 7:
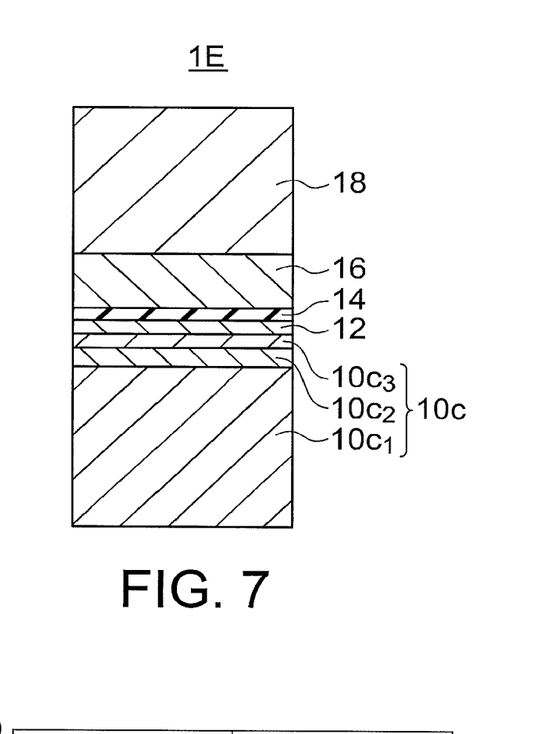
FIG. 7 is a cross-sectional view of a magnetoresistive element according to a modification of the second embodiment.

FIG. 7 shows a magnetoresistive element according to a first modification of the second embodiment. The magnetoresistive element 1E according to the first modification is obtained by replacing the base layer 10b of the magnetoresistive element 1D according to the second embodiment shown in FIG. 5 with a base layer 10c. The base layer 10c includes a first base layer $10c_1$ containing at least one of Hf, Zr, Al, Be, Mg, Ca, Sr, Ba, Sc, Y, and La, a second base layer $10c_2$ containing nitrogen and disposed between the first base layer $10c_1$ and the storage layer 12, and a third base layer $10c_3$ containing boron and disposed between the second base layer $10c_2$ and the storage layer 12. The boron concentration (atomic %) of the third base layer $10c_3$ is higher than the boron concentration (atomic %) of the storage layer 12. For example, the storage layer 12 is formed of $Co_{16}Fe_{64}B_{20}$, and the third base layer $10c_3$ is formed of $Hf_{50}B_{50}$ having a thickness of 1 nm or less. The first base layer $10c_1$ preferably contains less nitrogen than the second base layer $10c_2$, or no nitrogen so that the first base layer $10c_1$ may be flattened easily.

Figure 8:
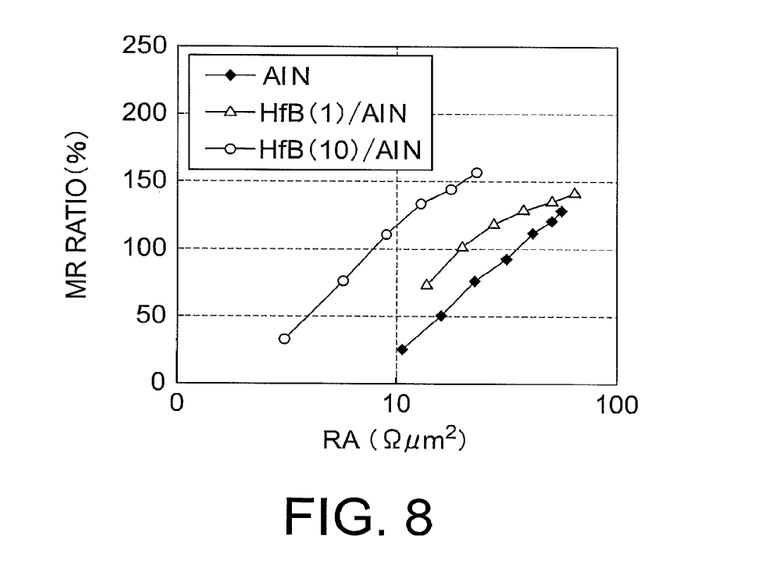
FIG. 8 is a diagram showing the dependency of the MR ratio on the base layer.

An MTJ element including a base layer of a single layer containing nitrogen (for example, AlN), and MTJ elements each including a base layer having a multilayer structure with a first base layer containing nitrogen and a second base layer containing boron are prepared. FIG. 8 shows a result of the comparison in MR ratio among these MTJ elements. The lateral axis in FIG. 8 indicate the area resistance, and the longitudinal axis indicates the MR ratio. The first base layer is a AlN layer having a thickness of about 6 Å, and the second base layer is a $Hf_{50}B_{50}$ layer. It can be understood from FIG. 8 that the base layers each having a multilayer structure obtain higher MR ratios. Thus, a base layer with a multilayer structure provides a higher MR ratio, which may improve the spin torque, thereby reducing the write current. The thickness of the base layer that is a single layer containing nitrogen, and the thickness of the first base layer containing nitrogen are preferably 0.2 nm or more and 2 nm or less as in the first embodiment. The material of the first base layer $10c_1$ is preferably conductive, and may be oxidized to become an insulating material during the re-deposition on the side portions of the tunnel barrier layer (intermediate layer) when the MTJ element is processed. For example, the first base layer $10c_1$ is formed of a material containing at least one of Hf, Zr, Al, Be, Mg, Ca, Sr, Ba, Sc, Y, and La.

The materials of the intermediate layer (tunnel barrier layer), the reference layer 16, and the electrode 18 of the second embodiment and its modifications are the same as the materials of these elements in the first embodiment.

As in the case of the first embodiment, the second embodiment and its modification may reduce the write current.

(Third Embodiment)

Figure 9:
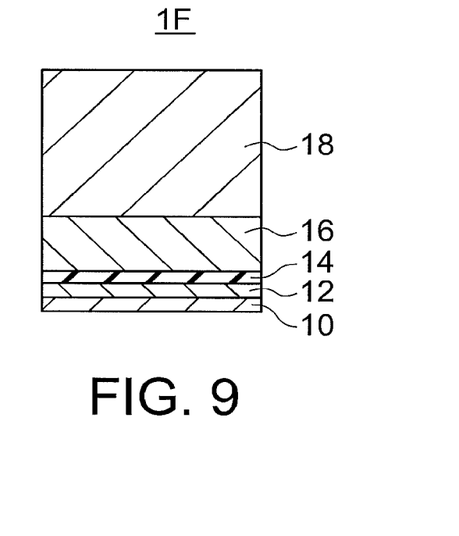
FIG. 9 is a cross-sectional view showing a magnetoresistive element according to a third embodiment.

FIG. 9 shows a magnetoresistive element according to a third embodiment. The magnetoresistive element 1F according to the third embodiment has a multilayer structure in which a base layer 10, a storage layer 12, an intermediate layer (tunnel barrier layer) 14, a reference layer 16, and an electrode 18 are stacked in this order.

The storage layer 12 is formed of, for example, $Co_{16}Fe_{64}B_{20}$. A high perpendicular magnetic anisotropy may be obtained by setting the Fe concentration (atomic %) of the storage layer 12 to be higher than the Co concentration (atomic %). A high perpendicular magnetic anisotropy would improve the nonvolatile performance of devices, thereby contributing to a decrease in power consumption.

The base layer 10 is formed of a compound containing nitrogen. For example, the base layer 10 is formed of a nitride containing at least one of Al, Sc, Y, La, and In. The base layer 10 of a compound containing nitrogen would suppress the magnetic interaction with a material containing a transition metal such as Fe and Co as a main constituent. Therefore, the storage layer 12 may have a low Gilbert damping constant.

Figure 10:
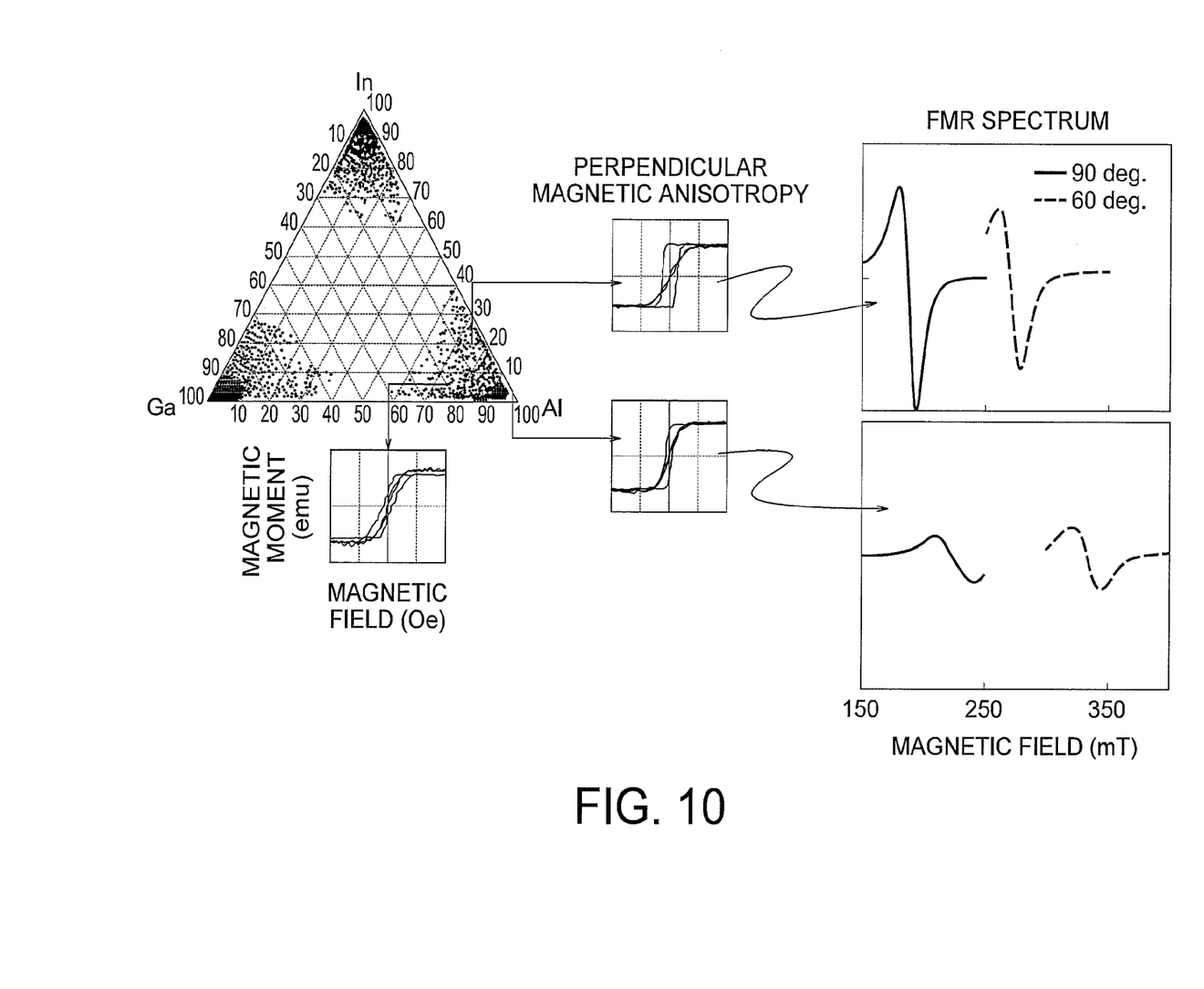
FIG. 10 shows the magnetic characteristic measurements and the ferromagnetic resonance (FMR) measurements of storage layers on nitride base layers.

However, there is a problem in that a storage layer on a nitride layer may have a concave-convex surface. As a result, the Gilbert damping constant of the storage layer on the nitride layer may increase, thereby increasing the write current. FIG. 10 shows the result of the magnetic characteristic measurements and the ferromagnetic resonance (FMR) measurements of storage layers, one being on a base layer of AlN, and the other being on a base layer of AlInN. As can be understood from FIG. 10, the base layer of AlInN results in a better perpendicular magnetic anisotropy than the base layer of AlN, and the width between the peaks of resonant magnetic fields in the FMR measurement is narrower for the base layer of AlInN than for the base layer of AlInN. The width between peaks is dependent on the magnitude of the Gilbert damping constant. Accordingly, the Gilbert damping constant is smaller, and therefore the write current is lower for the base layer of AlInN. The same effect may be obtained for AlScN, AlYN, AlLaN, and ScN. Therefore, the base layer 10 is preferably formed of AlInN AlScN, AlYN, AlLaN, or ScN. In other words, the base layer 10 is preferably formed of nitrogen and at least one of Al, Sc, Y, and La. The thickness of the AlInN, AlScN, AlYN, AlLaN, or ScN film is preferably 0.2 nm or more and 2 nm or less as in the first embodiment. As can be understood from FIG. 10, the ratio of In is preferably lower than the ratio of Al in AlInN, and the ratio of Al is preferably lower than the ratio of Sc, Y, or La in AlScN, AlYN, or AlLaN. This also applies to the first embodiment. The AlInN, AlScN, AlYN, AlLaN, or ScN film may be continuous, or separated by another material.

(Modification)

Figure 11:
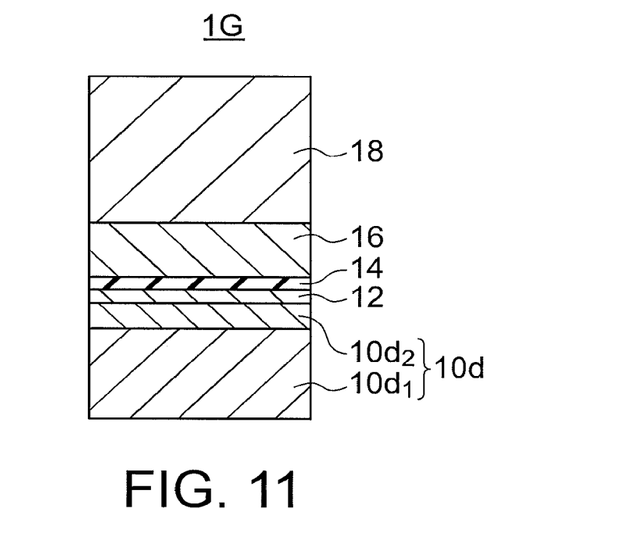
FIG. 11 is a cross-sectional view of a magnetoresistive element according to a modification of the third embodiment.

FIG. 11 shows a magnetoresistive element according to a modification of the third embodiment. The magnetoresistive element 1G according to the modification is obtained by replacing the base layer 10 of the magnetoresistive element 1F according to the third embodiment shown in FIG. 9 with a base layer 10d. The base layer 10d includes a first base layer $10d_1$ and a second base layer $10d_2$ disposed between the first base layer $10d_1$ and the storage layer 12.

The material of the first base layer $10d_1$ is preferably conductive, and may be oxidized to become an insulating material during the re-deposition on the side portions of the tunnel barrier layer (intermediate layer) when the MTJ element is processed. For example, the first base layer $10d_1$ is formed of a material containing at least one of Hf, Zr, Al, Be, Mg, Ca, Sr, Ba, Sc, Y, and La.

The second base layer $10d_2$ is formed of a compound containing nitrogen, like the base layer 10 of the third embodiment. For example, the second base layer $10d_2$ is formed of a nitride containing at least one of Al, Sc, Y, La, and In. The material of the second base layer $10d_2$ is preferably AlInN, AlScN, AlYN, AlLaN, or ScN. The AlInN, AlScN, AlYN, AlLaN, or ScN layer preferably has a thickness of 0.2 nm or more and 2 nm or less as in the first embodiment. The ratio of In is preferably lower than the ratio of Al in the AlInN layer, and the ratio of Al is preferably lower than the ratio of Sc, Y, or La in the AlScN, AlYN, or AlLaN layer. The second base layer $10d_2$ of AlInN, AlScN, AlYN, AlLaN, or ScN may be continuous, or separated by another material.

The materials of the intermediate layer (tunnel barrier layer), the reference layer 16, and the electrode 18 of the third embodiment and its modifications are the same as those for the first embodiment.

The third embodiment and its modifications may reduce the write current as in the case of the first embodiment.

(Fourth Embodiment)

A magnetic memory (MRAM) employing a spin transfer torque write method according to a fourth embodiment will be described below.

Figure 12:
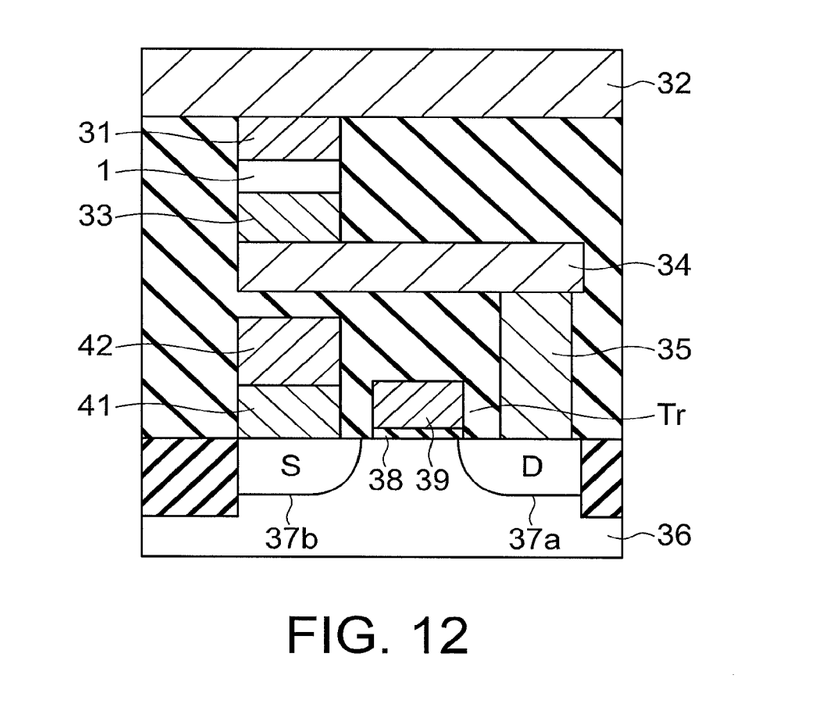
FIG. 12 is a cross-sectional view of a memory cell of a magnetic memory according to a fourth embodiment.

The MRAM according to the fourth embodiment includes a plurality of memory cells. FIG. 12 is a cross-sectional view of a main part of one of the memory cells of the MRAM according to the fourth embodiment. The memory cell includes, as a storage element, a magnetoresistive element according to any of the first to third embodiments and their modifications. In the descriptions of the fourth embodiment, the storage element is the magnetoresistive element (MTJ element) 1 according to the first embodiment.

As shown in FIG. 12, the top surface of the MTJ element 1 is connected to a bit line 32 via an upper electrode 31. The lower surface of the MTJ element 1 is connected to a drain region 37a of source/drain regions 37a and 37b of a semiconductor substrate 36 via a lower electrode 33, an extraction electrode 34, and a plug 35. The drain region 37a, the source region 37b, a gate insulating film 38 formed on the substrate 36, and a gate electrode 39 formed on the gate insulating film 38 constitute a selection transistor Tr. The selection transistor Tr and the MTJ element 1 constitute one memory cell of the MRAM. The source region 37b is connected to a bit line 42 via a plug 41. The lower electrode 33 and the plug 35 may be directly connected to each other without using the extraction electrode 34 by disposing the plug 35 below the lower electrode 33. Each of the bit lines 32 and 42, the electrodes 31 and 33, the extraction electrode 34, and the plugs 35 and 41 is formed of such elements as W, Al, AlCu, and Cu.

Figure 13:
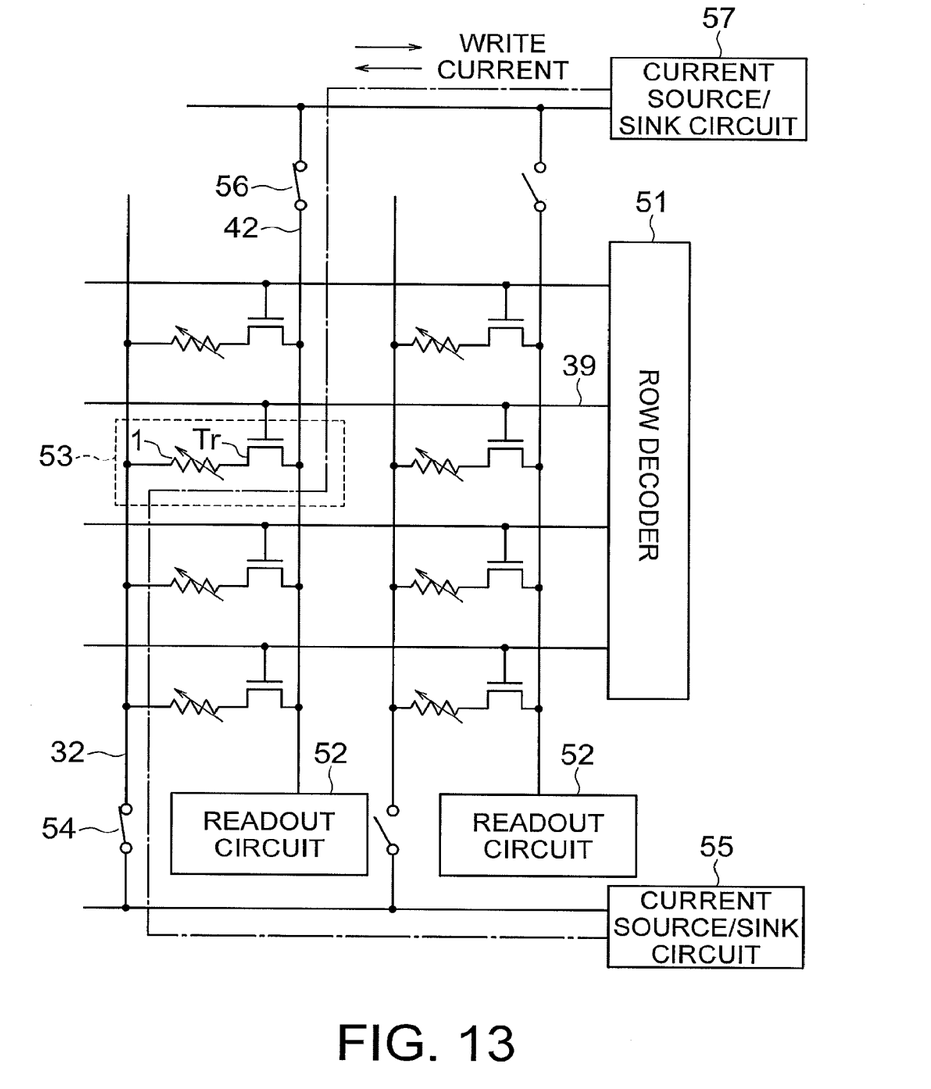
FIG. 13 is a circuit diagram of a main part of the magnetic memory according to the fourth embodiment.

Memory cells each having the structure shown in FIG. 12 are arranged in rows and columns to form a memory cell array in the MRAM according to the fourth embodiment. FIG. 13 is a circuit diagram showing a main part of the MRAM according to the fourth embodiment.

As shown in FIG. 13, a plurality of memory cells 53 each including the MTJ element 1 and the selection transistor Tr are arranged in rows and columns. A first terminal of each of the memory cell 53 connected to the same column is connected to the same bit line 32, and a second terminal is connected to the same bit line 42. Gate electrodes (word line) 39 of the selection transistors Tr of the memory cells 53 connected to the same row are connected to one another, and are further connected to a row decoder 51.

Each of the bit line 32 is connected to a current source/sink circuit 55 via a switching circuit 54 such as a transistor. Each of the bit line 42 is connected to a current source/sink circuit 57 via a switching circuit 56 such as a transistor. The current source/sink circuits 55 and 57 supply or extract a write current to or from the bit lines 32 and 42.

Each of the bit line 42 is connected to a readout circuit 52. The readout circuit 52 may be connected to each of the bit lines 32. The readout circuit 52 includes such circuits as a read current circuit, a sense amplifier, etc.

In a write operation, one of the switching circuits 54 and one of the switching circuits 56 connected to the memory cell to be written, and the selection transistor Tr of the memory cell to be written are turned ON to form a current path passing through the memory cell to be written. One of the current source/sink circuits 55 and 57 serves as a current source circuit, and the other serves as a current sink circuit depending on the data to be written. As a result, a write current flows in a direction determined by the data to be written.

With respect to the writing speed, the spin transfer torque writing may be performed with a current having a pulse width of a few nanoseconds to a few microseconds.

In a read operation, a read current that is satisfactorily low not to cause magnetization switching in the designated MTJ element 1 is supplied from a read current circuit in the same manner as the write operation. The readout circuit 52 determines the resistance state of the MTJ element 1 by comparing, with a reference value, a current value or a voltage value of the MTJ element 1 resulting from a resistance value obtained from the magnetization state.

The current pulse width in the read operation is preferably narrower than the current pulse width in the write operation because this may reduce the possibility of erroneous writing caused by the read current. This is based on the fact that a narrower pulse width of a write current leads to a greater absolute value thereof.

As described above, a magnetic memory including a magnetoresistive element capable of reducing a write current may be obtained according to the fourth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a first layer comprising nitrogen;
a first magnetic layer;
a second magnetic layer disposed between the first layer and the first magnetic layer; and
an intermediate layer disposed between the first magnetic layer and the second magnetic layer,
wherein the second magnetic layer comprises a second layer comprising boron and a third layer disposed between the second layer and the intermediate layer and comprising boron, and the second layer is in contact with the first layer, and
wherein a boron concentration of the third layer is lower than a boron concentration of the second layer.

2. A magnetoresistive element comprising:
a first layer comprising nitrogen;
a first magnetic layer;
a second magnetic layer disposed between the first layer and the first magnetic layer; and
an intermediate layer disposed between the first magnetic layer and the second magnetic layer,
wherein the second magnetic layer comprises a second layer comprising boron, a third layer disposed between the second layer and the intermediate layer and comprising boron, and a fourth layer disposed between the second layer and the first layer and comprising boron, and the fourth layer is in contact with the first layer, and
wherein a boron concentration of the third layer is lower than a boron concentration of the second layer, and a boron concentration of the fourth layer is lower than the boron concentration of the second layer.

3. The element according to claim 2, further comprising a fifth layer comprising at least one of Hf, Zr, Al, Be, Mg, Ca, Sr, Ba, Sc, Y, and La, and wherein the first layer is disposed between the fifth layer and the fourth layer.

4. The element according to claim 3, wherein the first layer further comprises at least one of Al, Sc, Y, and La and has a thickness of 0.2 nm or more and 2 nm or less.

5. The element according to claim 2, wherein
the second layer comprises CoFeHfB, and
the third layer comprises CoFeB.

6. A magnetoresistive element comprising:
a first magnetic layer;
a multilayer structure comprising a first layer comprising nitrogen, and a second layer comprising boron, the second layer being in contact with the first layer and the second layer being between the first layer and the first magnetic layer;
a second magnetic layer disposed between the second layer and the first magnetic layer, the second magnetic layer having a boron concentration lower than a boron concentration of the second layer; and
an intermediate layer disposed between the second magnetic layer and the first magnetic layer.

7. The element according to claim 6, wherein
the multilayer structure further comprises a third layer comprising at least one of Hf, Zr, Al, Be, Mg, Ca, Sr, Ba, Sc, Y, and La, and
the first layer is between the third layer and the second layer.

8. The element according to claim 6, wherein the second layer has a thickness of 1 nm or less.

9. A magnetoresistive element, comprising:
a first layer comprising at least one of AlInN, AlYN and AlLaN;
a first magnetic layer;
a second magnetic layer disposed between the first layer and the first magnetic layer; and
an intermediate layer disposed between the first magnetic layer and the second magnetic layer.

10. The element according to claim 9, further comprising a second layer comprising at least one of Hf, Zr, Al, Be, Mg, Ca, Sr, Ba, Sc, Y, and La, and wherein the first layer is disposed between the second layer and the second magnetic layer.

11. The element according to claim 9, wherein the first layer has a thickness of 0.2 nm or more and 2 nm or less.

12. A magnetic memory, comprising:
the magnetoresistive element according to claim 2;
a first wiring line electrically connected to the first magnetic layer; and a second wiring electrically connected to the second magnetic layer.

13. The memory according to claim 12, further comprising a fifth layer comprising at least one of Hf, Zr, Al, Be, Mg, Ca, Sr, Ba, Sc, Y, and La, and wherein the first layer is disposed between the fifth layer and the second layer.

14. The memory according to claim 13, wherein the first layer further comprises at least one of Al, Sc, Y, and La and has a thickness of 0.2 nm or more and 2 nm or less.

15. The memory according to claim 12, wherein
the second layer comprises CoFeHfB, and
the third layer comprises CoFeB.

16. The element according to claim 6, wherein
the first layer further comprises at least one of Al, Sc, Y, and La, and
the second layer comprises HfB.

17. The element according to claim 9, wherein the second magnetic layer comprises boron.

18. The element according to claim 17, wherein the second magnetic layer is in contact with the first layer.

19. A magnetic memory comprising:
the magnetoresistive element according to claim 16;
a first wiring electrically connected to the first magnetic layer; and
a second wiring electrically connected to the second magnetic layer.

* * * * *